United States Patent [19]

Yamagata et al.

[11] Patent Number: 5,250,460
[45] Date of Patent: Oct. 5, 1993

[54] METHOD OF PRODUCING SEMICONDUCTOR SUBSTRATE

[75] Inventors: Kenji Yamagata, Kawasaki; Takao Yonehara, Atsugi, both of Japan

[73] Assignee: Canon Kabushiki Kaisha, Tokyo, Japan

[21] Appl. No.: 958,724

[22] Filed: Oct. 9, 1992

[30] Foreign Application Priority Data

Oct. 11, 1991 [JP] Japan .................. 3-292258

[51] Int. Cl.⁵ ........................................... H01L 21/76
[52] U.S. Cl. ............................. 437/62; 437/225; 437/974; 148/DIG. 12; 148/DIG. 135; 148/DIG. 150
[58] Field of Search .............. 437/62, 225, 574; 148/DIG. 12, DIG. 135, DIG. 150

[56] References Cited

U.S. PATENT DOCUMENTS 4,983,539  1/1991  Yamagata et al. ............... 437/110
5,070,034 12/1991  Satoh et al. ...................... 437/52

FOREIGN PATENT DOCUMENTS 0499488  8/1992  European Pat. Off. .

OTHER PUBLICATIONS

Journal of Crystal Growth vol. 63, No. 3, pp. 547-553, Oct. 11, 1983, Kazuo Imai et al., "Crystalline Quality of Silicon Layer Formed by Fipos Technology".

T. Hamaguchi et al., "Device Layer Transfer Technique Using Chemi-Mechanical Polishing", *Japanese Journal of Applied Physics*, vol. 23, No. 10, Oct. 1984, pp. L815-L817.

L. Vescan et al., "Low-Pressure Vapor-Phase Epitaxy of Silicon On Porous Silicon," *Materials Letters*, vol. 7, No. 3, Sep. 1988, pp. 94-98.

Patent Abstracts of Japan, vol. 004, No. 044 (E-005) Apr. 5, 1980 & JP-A-55 016 464 (NEC Corp.) Feb. 5, 1980.

Tsao, "Buried Insulators and/or Conductors in Single-Crystal Silicon Using Porous Silicon Techniques", Mat. Res. Soc. Symp. Proc. vol. 107, 1988 Materials Research Society; pp. 429-440.

*Primary Examiner*—Brian E. Hearn
*Assistant Examiner*—Trung Dang
*Attorney, Agent, or Firm*—Fitzpatrick, Cella, Harper & Scinto

[57] ABSTRACT

A method of producing a semiconductor substrate, comprises the steps of: forming pores in the entire body of a single-crystal silicon substrate by anodization; epitaxially growing a single-crystal silicon layer on a surface of the porous single-crystal silicon substrate; sticking a supporting substrate to the surface of the epitaxial layer of single-crystal silicon by using an adhesive; selectively etching the porous single-crystal silicon substrate; sticking the epitaxial layer fast to a transparent insulating substrate containing $SiO_2$ as a main constituent; separating the supporting layer from the epitaxial layer by removing the adhesive; and heat-treating the epitaxial layer stuck fast on the transparent insulating layer. Alternatively, a porous layer is formed in a surface portion of a single-crystal silicon substrate, and then, the non-porous portion is removed before the porous layer is selectively etched.

4 Claims, 4 Drawing Sheets

FIG. I(A) 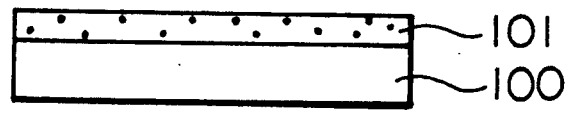
FIG. I(B) 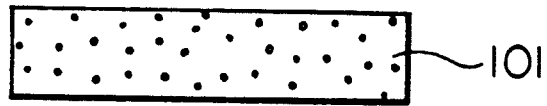
FIG. I(C) 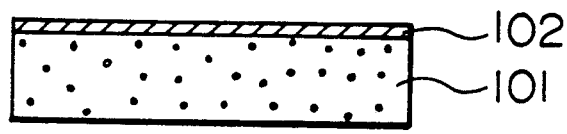
FIG. I(D) 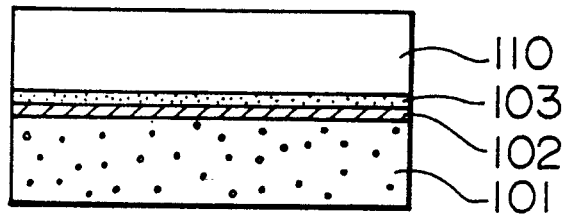
FIG. I(E) 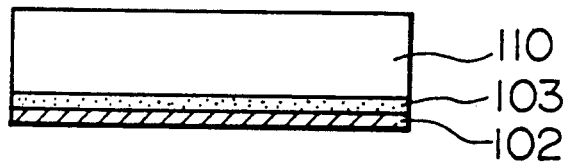
FIG. I(F) 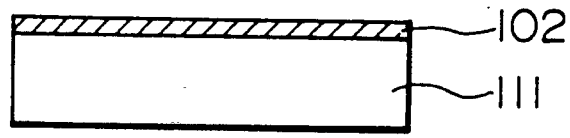

METHOD OF PRODUCING SEMICONDUCTOR SUBSTRATE

BACKGROUND OF THE INVENTION

1. Field of the Invention

The present invention relates to a method of producing a semiconductor substrate and, more particularly, to a method of producing a semiconductor substrate which is formed on a transparent insulator substrate made of, for example, glass, and which is suitable for multi-functional and high-performance electronic devices or integrated circuits.

2. Description of the Related Art

Formation of a single-crystal silicon semiconductor layer on an insulator is widely known as the SOI (silicon on insulator) methods. Many studies have been made on the SOI methods because the substrate formed by these method achieves several advantages that a bulk Si substrate usually used to produce Si integrated circuits fails to achieve. The SOI methods and the substrate formed thereby have the following advantages:

1. Dielectric isolation is easy, so that high integration can be achieved.
2. The substrate has a strong resistance to radioactivity.
3. Floating capacity is reduced, so that the production process can be speeded up.
4. The well process can be omitted.
5. Latch-up can be prevented.
6. The substrate facilitates forming complete-depletion field-effect transistors when the substrate is formed into thin films. To achieve many advantages in device characteristics as listed above, many studies have been done on methods of forming the SOI structure for the past few decades. Such studies are concisely described in, for example, Special Issue, "Single-Crystal Silicon on Non-Single-Crystal Insulators" edited by G. W. Cullen, Journal of Crystal Growth, vol. 63, No. 3, pp 429–590 (1983).

The SOS (silicon on sapphire) method has been long known as one of the methods that are developed to such a high level as to facilitate forming substantially integrated circuits. In the SOS method, a silicon film is heteroepitaxially grown on a single-crystal sapphire substrate by using the CVD (chemical vapor deposit) method. Although this method is evaluated as a successfully developed SOI method, the lattice unconformity at the interface between the silicon film and the base sapphire substrate may cause substantial lattice defects, or a substantial amount of aluminium may leak from the sapphire substrate into the silicon film. Moreover, the sapphire substrate is costly, and it is difficult to form a large-area sapphire substrate. Therefore, the SOS method has not been widely applied.

Recently, many methods have been made to achieve use of silicon substrates, instead of sapphire substrates, for forming SOI structures. Such methods are roughly divided into the following three groups:

(1) A method comprising the steps of: oxidizing a surface of a single-crystal silicon substrate; removing a portion of the thus formed oxide film to partially reveal the silicon substrate; epitaxially growing a single-crystal silicon layer in the lateral direction on the SiO$_2$ substrate by using the revealed portion as a seed.

(2) A method in which using a single-crystal silicon substrate as an active layer, an embedded layer of SiO$_2$ is formed inside a lower portion thereof by a certain technique.

(3) A method comprising the steps of: sticking a single-crystal silicon substrate to an insulating substrate; and grinding or etching the silicon substrate so as to leave a single-crystal silicon layer having a desired thickness.

Basically, there are three different ways to achieve method (1). In one way (a vapor phase method), a single-crystal layer is epitaxially grown directly by the CVD technique. In another way (a solid phase method), a single-crystal silicon layer is epitaxially grown laterally with respect to the solid phase by heat-treating deposited amorphous silicon. In the third way (a liquid phase method), a single-crystal silicon layer is grown on an amorphous or polycrystal silicon layer either by melting recrystallization (beam annealing) which is performed by irradiating the silicon layer with a converged energy beam, such as electron beam or laser beam, or by zone melting recrystallization which is performed by scanning, in a belt-like course, the silicon layer with a rod-like heater. These methods have different advantages, but they have significant problems in controllability, productivity, and uniformity and quality of the products. The CVD (the vapor phase method) requires well-controllable grinding technique and sacrifice oxidation. The solid phase method fails to achieve satisfactory crystallization. The beam annealing of the liquid phase method has problems in time required for converged beam scanning, overlapping of the beam and controllability in, e.g., focus adjustment. The zone melting recrystallization is the most satisfactorily developed and has been tested to produce relatively large scale integrated circuits. However, it still fails to reduce the number of lattice defects, such as sub-boundaries, in the products to a required level, and therefore, the products of this method are not good enough to be used to produce minority-carrier devices.

To achieve method (2), many laboratories have been studying a method called SIMOX (separation by ion implanted oxygen), in which an SiO2 layer is formed inside a single-crystal silicon substrate by injecting oxygen ions. SIMOX is well matched with the silicon process and regarded as the most satisfactorily developed technique in method (2). However, $10^{18}$ oxygen ions or more per square centimeter must be injected in order to form an SiO$_2$ layer. Such oxygen injection requires a long time, resulting in low productivity and increasing the cost of wafers. Moreover, a substantial number of lattice defects are still produced in the products, and therefore, the products are not good enough to be used to produce minority-carrier devices on an industrial scale. Another method is known in which SOI structure is formed by a technique of dielectric isolation which is performed by oxidizing a porous silicon. In this method, n-type silicon layer patches are formed on a surface of a p-type single-crystal silicon substrate by either injecting proton ions (Imai, et al., J. Crystal Growth vol. 63, 547 (1983)) or epitaxial growth and patterning, and many pores are formed selectively in the p-type silicon substrate so that porous p-type silicon substrate surrounds the n-type silicon layer patches, by anodization in HF solution, and then, the n-type silicon layer patches are dielectric-isolated by accelerated oxidation. Because the areas of revealed non-porous p-type single-crystal silicon are formed before the device processes, freedom in designing a device is often limited.

Basically, there are two methods to achieve method (3). In one method, a silicon substrate is used as a supporting substrate (in this case, the surface on one side of the silicon substrate is oxide). In the other method, an insulating substrate made of material other than silicon is used as a supporting substrate. In both methods, after the supporting substrate is stuck to another silicon substrate, heat treatment at a temperature about 1,000° C. is performed in order to enhance the bonding between the two substrates. No matter what material may be used for the supporting substrate, the most crucial process is to make the silicon substrate into a thin film. Generally, a silicon substrate having a thickness of several hundred micrometers must be ground or etched to a uniform thickness of several micrometers, in some cases, 1 $\mu$m or less. There are technical difficulties in achieving good controllability of the process and substantial uniformity of the pieces. In the method employing an non-silicon insulating supporting substrate, problems are often caused by the heat treatment at 1,000° C. Because the coefficients of thermal expansion of the two substrates are different, the silicon substrate and/or the supporting substrate stuck to each other may warp, break or come off from each other (in some cases, the two substrates do not stick to each other from the beginning). Materials having coefficients of thermal expansion close to that of silicon have been tested. However, no known materials have heat resistances for the temperatures of the heat treatment for enhancing the bonding and the device-forming process.

As described above, a method of producing with good productivity SOI substrates which can be suitably used to produce high-performance electronic devices has not been developed. Particularly, for forming an SOI structure on a transparent substrate so that the substrate acquires functions, methods (1) and (2) are naturally inappropriate. Even the method 3 is not very suitable for that purpose. In most cases where the method 3 is employed, a supporting silicon substrate and a silicon substrate are stuck to each other by using a thermally oxidized film therebetween. It is very difficult to form an SOI by grinding the silicon substrate stuck onto the transparent supporting substrate having a coefficient of thermal expansion different from that of silicon.

SUMMARY OF THE INVENTION

Accordingly, it is an object of the present invention to provide a method of producing a semiconductor substrate composed of a single-crystal silicon membrane and a transparent insulating substrate which has a coefficient of thermal expansion substantially different from that of the single-crystal silicon membrane and yet is stuck to the single-crystal silicon membrane.

It is another object of the present invention to provide a method of producing a semiconductor substrate, which method can be used, instead of the costly SOS and SIMOX methods, to produce a high-performance semiconductor substrate for a large-scale integrated circuit.

According to one aspect of the present invention, a method of producing a semiconductor substrate comprises the steps of: forming pores in the entire body of a single-crystal silicon substrate by anodization; epitaxially growing a single-crystal silicon layer on a surface of the porous single-crystal silicon substrate having many pores; sticking a supporting substrate of a desired kind to the surface of the epitaxial layer of single-crystal silicon by using an adhesive of a desired kind therebetween; selectively etching the porous single-crystal silicon substrate; sticking the epitaxial layer fast to a transparent insulating substrate containing $SiO_2$ as a main constituent; separating the supporting layer from the epitaxial layer by removing the adhesive; and heat-treating the epitaxial layer stuck fast on the transparent insulating layer.

According to another aspect of the present invention, a method of producing a semiconductor substrate comprises the steps of: forming pores in a surface layer at one side of a single-crystal silicon substrate by anodization; epitaxially growing a single-crystal silicon layer on the external surface of the porous silicon layer having many pores formed as above; sticking a supporting substrate of a desired kind to the surface of the epitaxial layer of single-crystal silicon by using an adhesive of a desired kind therebetween; removing the non-porous silicon portion of the single-crystal silicon substrate by grinding; selectively etching the porous silicon layer; sticking the epitaxial layer fast to a transparent insulating substrate containing $SiO_2$ as a main constituent; separating the supporting layer from the epitaxial layer by removing the adhesive; and heat-treating the epitaxial layer stuck fast on the transparent insulating layer.

More specifically, in a method according to the present invention, an SOI substrate (semiconductor substrate) is produced as follows. Single-crystal silicon is epitaxially grown on a porous surface of a partially or entirely-porous single-crystal silicon substrate. A supporting substrate of a desired kind is temporarily stuck to the surface of the epitaxial layer by using an adhesive. Then, the porous portion of the single-crystal silicon substrate is selectively etched (or before selectively etching the porous portion, the non-porous portion is removed by grinding) in order to obtain a single-crystal silicon membrane. After the single-crystal silicon membrane is stuck fast to a transparent insulating substrate containing $SiO_2$ as a main constituent, the supporting substrate is separated therefrom by removing the adhesive. The obtained substrate having single-crystal silicon membrane (the epitaxial layer) stuck fast to the transparent insulating substrate is heat-treated so as to promote formation of strong bonds between Si and SiO2, i.e., the main constituent of the insulating substrate. The SOI substrate is thus produced. In a normal method, formation of a substrate composed of two different materials stuck to each other is generally difficult because of the different coefficients of thermal expansion of the two materials. However, in the method of the present invention, since the epitaxially grown single-crystal silicon membrane is very thin, the absolute value of the stress caused by the bond formation in the interface between the two materials is substantially small, and therefore, the substrate having the two different materials stuck to each other can be formed. Additionally, the reason for temporarily sticking the epitaxial layer to the supporting substrate of a desired kind is that if the epitaxial layer were immediately stuck to the transparent insulating substrate without being temporarily stuck to a supporting substrate, the transparent insulating layer would also be etched when the porous silicon portion is etched in an etching solution such as mixed alcohol solution containing fluorine and hydrogen peroxide water-solution.

In other words, in the method of the present invention: the single-crystal layer epitaxially grown on the porous silicon is temporarily supported on a supporting substrate; the original porous portion of the silicon is selectively etched so as to obtain a membrane of the single-crystal silicon; after the membrane is stuck to the transparent insulating substrate, the adhesive and the supporting substrate are removed; and then the membrane stuck to the transparent insulating substrate is heat-treated at a high temperature. The method of the present invention substantially eliminates the problems which are caused by the different thermal expansion coefficients of two different materials in the conventional methods, such as breakage or separation of the membrane and warping of the substrates. Further, because it is easy to control the distribution of the film thicknesses of an epitaxial layer, the method of the present invention can achieve very good distribution of the thicknesses of the single-crystal silicon membrane of an SOI substrate. Still further, because a SOI substrate produced by this method substantially transmits light, such a property of the SOI substrate can be utilized to design a functional device. Further, this method can replace the costly SOS and SIMOX methods to produce semiconductor substrates which are suitable for large-scale integrated circuits having SOI structures.

Further objects, features and advantages of the present invention will become apparent from the following description of the preferred embodiments with reference to the attached drawings.

BRIEF DESCRIPTION OF THE DRAWINGS

FIGS. 1(A) to 1(F) schematically illustrate a method of producing semiconductor substrates, according to the present invention.

DESCRIPTION OF THE PREFERRED EMBODIMENTS

Figure 4:
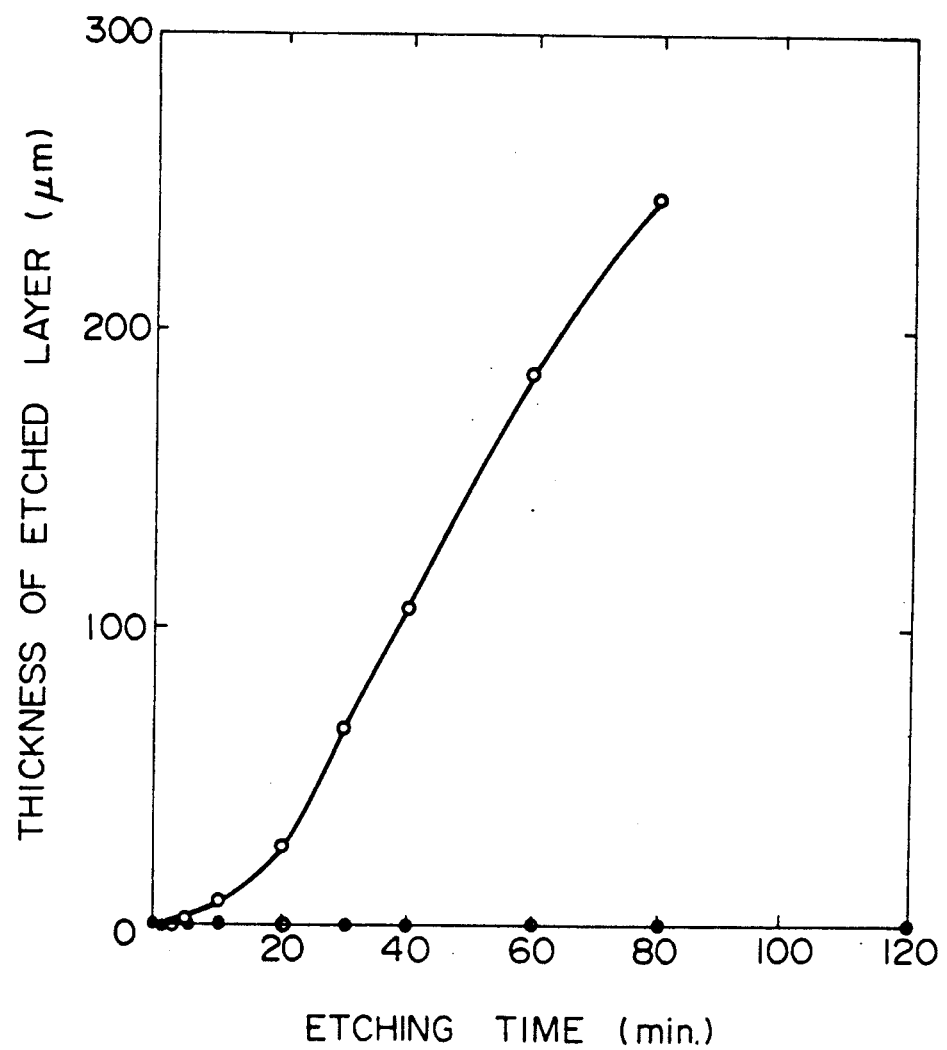
FIG. 4 is a graph showing the etching characteristics of porous and non-porous silicon substrates.

Porous silicon has two advantageous physical effects on the embodiments of the present invention. One of the effects is provided by the etching characteristic of porous silicon. While normal (non-porous) silicon is barely etched by hydrofluoric acid, porous silicon is relatively easily etched. If a mixed etching solution of fluorine, hydrogen peroxide water-solution and alcohol is used, the ratio of the rate of etching porous silicon to the rate of etching non-porous silicon is about $10^5:1$, as shown in FIG. 4 (in the figure, the blank circles indicate the etching of porous silicon and the solid circles indicate the etching of non-porous single-crystal silicon). Therefore, even a single-crystal silicon membrane having a substantially uniform thickness of about 1 $\mu$m can be formed by well-controlled selective etching. The other effect is provided by the epitaxial growth characteristic of porous silicon. Porous silicon has a single-crystal structure and pores densely present in a range from the surface to a depth of several tens to several hundreds of angstroms (Å). The epitaxial layer grown on the surface of such porous silicon has substantially the same crystalline properties as those of the epitaxial layer grown on the surface of non-porous single-crystal silicon substrate. Therefore, since this method uses single-crystal membranes substantially equivalent to the epitaxial layer grown on single-crystal silicon substrates, which are highly reliable as active layers, the method provides SOI substrates whose crystalline properties are better than those of the conventional SOI substrates.

The method of the present invention will be described with reference to FIGS. 1 and 2.

A single-crystal silicon substrate 100 is anodized to form a porous silicon layer or porous silicon substrate 101. The porous region that is formed may be in either a surface layer at one side of the substrate as shown in FIG. 1(A) or the entire substrate as shown in FIG. 1(B). If pores are formed only in a surface layer as shown in FIG. 1(A), an appropriate thickness of the porous region is about 10 to 100 $\mu$m.

Figure 2A:
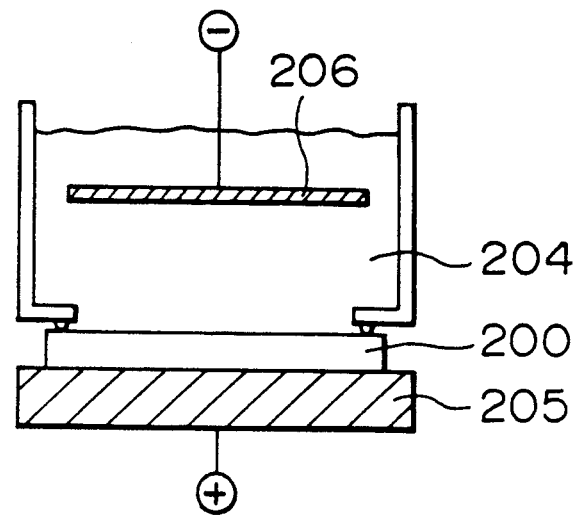
FIGS. 2(A) and (B) schematically illustrate an apparatus used to form pores in a silicon substrate.
Figure 2B:
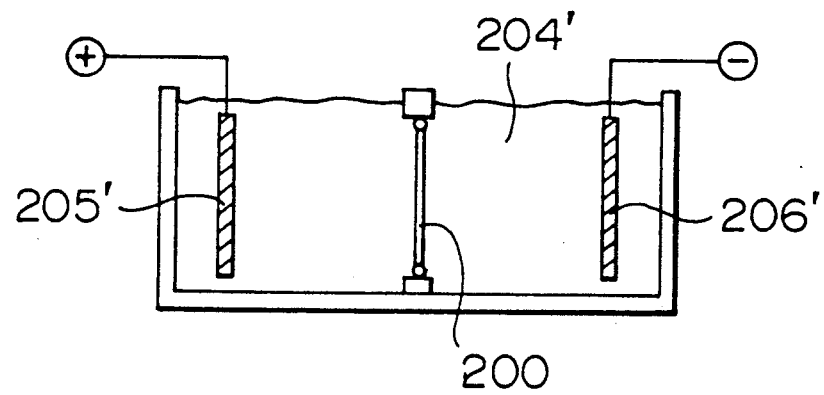

A process of forming a porous silicon will be described in detail with reference to FIGS. 2(A) and 2(B). A p-type single-crystal silicon substrate 200 is prepared for this process. If an n-type single-crystal silicon substrate is used, the n-type substrate must have a low resistance. The substrate 200 is set in an apparatus, as shown in FIG. 2(A). One side of the substrate 200 is in contact with a solution 204 containing hydrofluoric acid. The other side thereof is in contact with a metallic anode 205. A cathode 206 is placed in the solution 204. As shown in FIG. 2(B), a metallic anode 205', the substrate 200 and a cathode 206' may be placed altogether in a solution 204', the substrate 200 being arranged between the anode 205' and cathode 206'. In both arrangements, formation of pores in the substrate 200 starts from the side which is closer to the cathode. The hydrofluoric acid solution 204 is generally concentrated hydrofluoric acid solution (49% HF). A diluted HF solution is not preferable because an HF solution diluted with pure water (H$_2$O) to a certain concentration of lower causes etching of the substrate. Such a concentration is variable depending on the strength of the current. To efficiently remove air foam formed on the surface of the substrate 200 during anodization, alcohol, such as methanol, ethanol, propanol or isopropanol, may be added as a surface active agent to the solution. Instead of a surface active agent, a stirrer may be used to stir the solution during anodization. The cathode 206 is made of a material, such as gold (Au) or Platinum (Pt), that is not corroded by an HF solution. The anode 205 may be made of any material that is generally used. However, the surface of the anode 205 should preferably be coated with a metal having a corrosion-resistance to HF solution, because the HF solution 204 reaches the anode 205 when the substrate is entirely anodized. The maximum current value for this anodization is several hundred mA/cm$^2$, and the minimum current value may be anywhere above zero. The current value that is actually employed for this anodization is determined so that the porous silicon to be formed will facilitate good epitaxial growth on its surface. In general, a greater current causes a greater anodization rate and less density of the porous silicon, i.e., greater total volume of pores, which changes the conditions of epitaxial growth.

Then, as shown in FIG. 1(C), a non-porous single-crystal silicon layer 102 is epitaxially grown on the surface of the porous silicon layer or substrate 101 (the figure shows the porous silicon substrate 101). The epitaxial growth is performed by a known method, such as thermal CVD, reduced-pressure CVD, plasma SCD, molecular beam epitaxy or sputtering. The single-crystal silicon layer 102 is grown to the design thickness of the SOI layer. Preferably, the thickness of the layer 102 should be 2 $\mu$m or less. If a single-crystal silicon membrane 102 having a thickness greater than 2 $\mu$m is stuck fast to a transparent insulating substrate made mainly of SiO$_2$ and then heat-treated, a large stress is created in the interface of the silicon membrane 102 and the transparent insulating substrate because the two materials have substantially different thermal expansion coefficients. As a result, the silicon membrane may break, the substrate may warp, or separation may be caused in the interface of the two materials. If the thickness of the single-crystal silicon membrane 102 is 2 μm or less, the stress is reduced to a relatively low level, thus substantially preventing the above-mentioned breakage, separation and warping of the product.

Then, as shown in FIG. 1 (D), an adhesive 103 is applied to the surface of the single-crystal silicon layer (the epitaxial layer) 102, and a supporting substrate 110 is fixed thereto. The adhesive 103 is solid at a room temperature and softens when heated. Preferably, the adhesive 103 should be soluble in acid solutions, such as sulfuric acid, and organic solvents such as acetone or toluene. Waxes, such as electron wax, are very suitable for the adhesive 103. The shape, size (thickness), material or the like of the supporting substrate 110 may be as desired. If the supporting substrate is made of silicon (either single-crystal or polycrystal), the supporting member can be repeatedly used for a very long time.

Then, as shown in FIG. 1(E), a substantial portion of the substrate having the single-crystal silicon layer (the epitaxial layer) 102 is removed by etching and/or grinding in order to reveal the single-crystal silicon layer 102. If the entire portion to be removed is porous, the portion can be removed solely by etching. When the substrate including the supporting substrate 110 is dipped in the hydrofluoric acid solution, the porous portion 101 is selectively etched. If the portion to be removed includes a non-porous portion single-crystal portion, i.e. a portion of the silicon substrate 100, the non-porous portion should preferably be ground until the porous portion, i.e. the porous silicon layer 101, is exposed. Thus, the remaining porous portion is selectively etched in the HF solution. In either case, because the non-porous epitaxially-grown single-crystal silicon layer 102 hardly reacts with hydrofluoric acid, the layer 102 remains as a membrane adhered to the supporting substrate 110. Naturally, the supporting substrate 110 should be made of a material that barely reacts with HF solutions. The HF solution used for this etching contains not only hydrofluoric acid but also hydrogen peroxide (H$_2$O$_2$) water-solution and alcohol. The HF solution further containing acetic acid may be used for the selective etching. However, because such an HF solution further containing acetic acid also etches the single-crystal silicon membrane to some extent, the conditions of etching, such as etching time, must be carefully controlled.

Then, as shown in FIG. 1(F), a transparent insulating substrate 111 made mainly of SiO2 is stuck fast to the surface of the single-crystal silicon layer 102, which is exposed by the above-described selective etching. The transparent insulating substrate 111 is made of a material, such as fused quartz, synthetic quartz, high-melting-point (crystallized) glass or the like. The entire substrate including the transparent insulating substrate 111 is heated in order to melt the adhesive 103 and remove the supporting substrate 110. If a wax is used as the adhesive 103, heating can be performed at 200° C. or lower since normal waxes soften at about 100° C. After the supporting substrate 110 is removed, the residual adhesive on the single-crystal silicon layer (the epitaxial layer) 102 is thoroughly washed off with a sulfuric acid/hydrogen peroxide mixed solution or an organic solvent such as toluene. Though the single-crystal silicon membrane 102 and the transparent insulating substrate 111 are just stuck firmly to each other at this step, i.e., before heat treatment specifically for the purpose of forming bonds therebetween, this combined substrate can be handled in substantially the same way as an ordinary silicon substrate unless additional stress is provided. This is because hydrogen bonds are naturally formed in the interface between the single-crystal silicon membrane 102 and the transparent insulating substrate 111. Hydrogen bonds, one type of intermolecular bonds, increase in number, i.e. the bonding between the two materials becomes stronger, if the contact areas in the interface are larger, i.e. the flatnesses of the surfaces of the two materials are higher. Therefore, a weight may be put on the substrate so as to apply uniform pressure to the interface in order to obtain enhanced bonding between the two materials. Since a hydrogen bond is formed by an attractive force between a hydrogen atom (—H) and an oxygen atom (—O—), the bonding between the single-crystal silicon membrane 102 and the transparent insulating substrate 111 can be substantially enhanced by performing a surface treatment at the final step of the washing process before adhesion of the two materials, such surface treatment facilitating the formation of hydrogen bonds.

The combined substrate having the membrane and the transparent insulating substrate, which are stuck fast to each other by hydrogen bonds, is heat-treated to obtain a combination-type SOI substrate as shown in FIG. 1(F). The heat treatment is performed at 600° C. or higher in an atmosphere of oxygen, nitrogen, hydrogen and rare gasses. In general, heat treatment at a higher temperature provides a stronger bonding in the interface. This is explained as follows. At about 200° C. or higher, the hydrogen and oxygen atoms involved in hydrogen bonds are dehydrated in the form of H$_2$O, and then condensed silanol bonds (Si—O—Si) are formed. However, while H$_2$O formed by dehydration remains in the form of voids in the vicinity of the interface, the bonding strength in the interface does not reach its maximum. When the voids completely disappear, the bonding strength reaches its maximum. The bonding strength remains substantially the same (at the maximum level) even if the temperature is increased. Since the strength of this bonding reaches its maximum at about 900° C., an appropriate temperature for this heat treatment is about 1,000° C.

After being heat-treated, i.e., while being let to stand at a room temperature, the SOI substrate shrinks from the expansion state caused at a temperature at which silanol bonds are formed, with the silanol bonds being maintained. Because the contraction ratio of the single-crystal silicon membrane is greater than that of SiO$_2$ of the transparent insulating substrate, stress is caused in the interface. However, since the volume of the single-crystal silicon membrane is substantially small, the absolute value of the stress is also substantially small, so that the relatively bulky transparent insulating substrate is not substantially distorted or deformed. In addition, because the bonding strength is substantially greater than the stress, the single-crystal silicon membrane does not break or separate from the transparent insulating substrate.

Now, the preferred embodiments of the present invention will be described hereinafter.

[Embodiment 1]

With reference to FIGS. 1 and 2, Embodiment 1 of the present invention will be described in detail.

A 4-inch P-type (100) single-crystal silicon substrate (0.1 to 0.2 Ω.cm) having a thickness of about 200 μm was anodized by using an apparatus as shown in FIG. 2(A) in order to obtain a porous silicon substrate 101 as shown in FIG. 1(B). In this process, 49% HF solution was used as a solution 204, and the current density was 100 mA/cm$^2$. Pores were formed at a rate of 8.4 μm/min. It took 24 minutes to form pores in the entire p-type (100) silicon substrate having 200 μm. Then, a single-crystal silicon layer 102 was epitaxially grown to 1.0 μm on the P-type (100) porous silicon substrate 101 by the CVD method. A substrate as shown in FIG. 1(C) was thus formed. The deposition conditions were as follows:

using a gas of $SiH_4/H_2$;
at a gas flow of 0.62/140 (liter/min.);
at a temperature of 750° C.;
at a pressure of 80 Torr; and
at a growth rate of 0.12 μm/min.

Then, while the thus formed substrate was being heated on a hot plate, electron wax 103 was applied onto the single-crystal silicon layer 102, and a 4-inch silicon supporting substrate 110 was placed onto the electron wax 103, as shown in FIG. 1(D). Thus, the silicon supporting substrate 110 was temporarily adhered to the single-crystal silicon layer 102.

The thus-obtained substrate was dipped in a selective etching solution containing hydrofluoric acid. The porous portion (porous silicon substrate) 101 was selectively etched, as shown in FIG. 1(E). The composition of the etching solution and the rate of etching the porous silicon were, respectively:

HF: $H_2O_2$: $C_2H_5OH$ = 5:25:6
1.6 μm/min.

The entire porous portion 101 was etched in about 125 minutes. In this etching process, the rate of etching the single-crystal silicon layer 102 was 6 Å/hour. In other words, the single-crystal silicon layer 102 was hardly etched.

Then, the substrate having the supporting substrate 110 and the single-crystal layer 102 was washed with a mixed solution of hydrochloric acid/hydrogen peroxide solution/water (1:1:5) for 10 minutes, rinsed with pure water, and dried. Then, the single-crystal silicon layer 102 was stuck fast onto a 4-inch fused quartz substrate 111 (having a thickness of 525 μm) which had been washed and rinsed in substantially the same way as described above. While the substrate having the 4-inch fused quartz substrate was being heated and maintained at about 150° C. on a hot plate, the supporting substrate 110 was removed when the electron wax 103 softened. To completely remove the residual electron wax from the surface of the single-crystal silicon layer 102, the substrate was washed with a mixed solution of sulfuric acid/hydrogen peroxide solution (3:1). Finally, to complete the bonds between the quartz substrate 111 and the single-crystal silicon layer 102, the substrate was heat-treated in an anneal furnace in an atmosphere of nitrogen gas at a temperature of 1,000° C. for 2 hours. Thus, an SOI substrate composed of a transparent substrate carrying a single-crystal silicon membrane having a thickness of 1 μm was obtained.

[Embodiment 2]

Embodiment 2 will be described with reference to FIGS. 3(A) to 3(E).

Figure 3A:
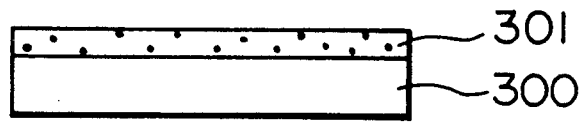
FIGS. 3(A) and 3(E) schematically illustrate another method of producing semiconductor substrates, according to the present invention.

A p-type (100) silicon substrate 300 having a thickness of 300 μm and a specific resistance of 0.01 Ω.cm was prepared. As shown in FIG. 3(A), a surface portion of the substrate 300 was formed into a porous silicon layer 301 having a thickness of 30 μm by substantially the same method as in Embodiment 1.

Figure 3B:
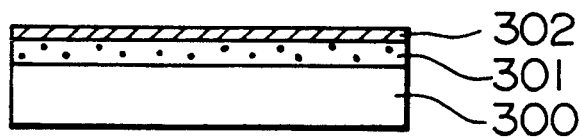

Then, as shown in FIG. 3(B), a single-crystal silicon layer 302 having a thickness of 1 μm was formed on the surface of the porous silicon layer 301 by using substantially the same method as in Embodiment 1.

Figure 3C:
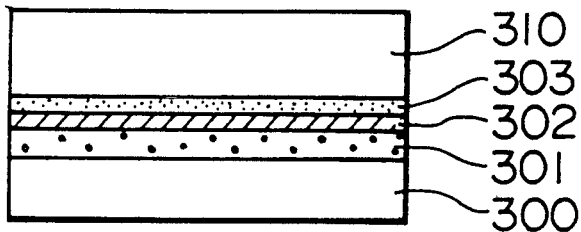

While the thus-formed substrate was being heated on a hot plate, electron wax 103 was applied onto the single-crystal silicon layer 302, and a 4-inch silicon supporting substrate 310 was temporarily fixed to the single-crystal silicon layer 302 with the electron wax 303 therebetween, as shown in FIG. 3(C).

Figure 3D:
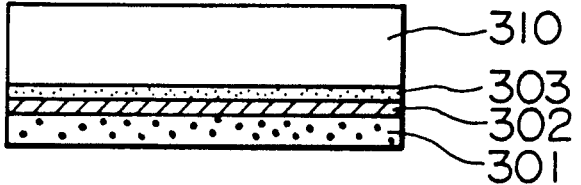

Then, as shown in FIG. 3(D), the single-crystal silicon substrate 300 was mechanically ground from the single-crystal side to remove a portion having a thickness of 280 μm. Thus, the porous silicon layer 301 was exposed. This substrate was dipped in an etching solution containing hydrofluoric acid, such solution being substantially the same solution as used in Embodiment 1. The porous silicon layer 301 was selectively etched.

Figure 3E:
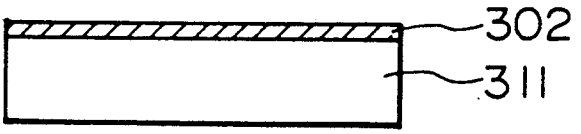

The following procedure was substantially the same as in Embodiment 1. After thorough washing, the single-crystal silicon layer 302 was stuck fast onto a 4-inch quartz substrate 311. The supporting substrate 310 was removed by melting the electron wax 303. After being washed, the substrate was heat-treated at about 1,000° C. An SOI substrate as shown in FIG. 3(E) was thus obtained.

While the present invention has been described with reference to what are presently considered to be the preferred embodiments, it is to be understood that the invention is not limited to the disclosed embodiments. To the contrary, the invention is intended to cover various modifications and equivalent arrangements included within the spirit and scope of the appended claims.

What is claimed is:

1. A method of producing a semiconductor substrate, comprising the steps of:

forming pores in the entire body of a single-crystal silicon substrate by anodization;

epitaxially growing a single-crystal silicon layer on a surface of the porous single-crystal silicon substrate having many pores;

sticking a supporting substrate of a desired kind to the surface of the epitaxial layer of single-crystal silicon by using an adhesive of a desired kind therebetween;

selectively etching said porous single-crystal silicon substrate;

sticking said epitaxial layer fast to a transparent insulating substrate containing $SiO_2$ as a main constituent;

separating said supporting layer from said epitaxial layer by removing said adhesive; and heat-treating the epitaxial layer stuck fast on said transparent insulating layer.

2. A method of producing a semiconductor substrate, comprising the steps of:

forming pores in a surface layer at one side of a single-crystal silicon substrate by anodization;

epitaxially growing a single-crystal silicon layer on the external surface of the porous silicon layer having many pores formed as above;

sticking a supporting substrate of a desired kind to the surface of the epitaxial layer of single-crystal silicon by using an adhesive of a desired kind therebetween;

removing the non-porous silicon portion of said single-crystal silicon substrate by grinding;

selectively etching said porous silicon layer;

sticking said epitaxial layer fast to a transparent insulating substrate containing $SiO_2$ as a main constituent;

separating said supporting layer from said epitaxial layer by removing said adhesive; and heat-treating the epitaxial layer stuck fast on said transparent insulating layer.

3. A method of producing a semiconductor substrate according to claim 1 or 2, wherein said adhesive is a thermally softening material.

4. A method of producing a semiconductor substrate according to claim 1 or 2, wherein said porous silicon portion is selectively etched by using a mixed alcohol solution containing fluorine and hydrogen peroxide water-solution.

* * * * *